United States Patent [19]

Yoshida et al.

[11] 4,282,574

[45] Aug. 4, 1981

[54] APPARATUS FOR INITIALIZING A VEHICLE CONTROLLING DIGITAL COMPUTER

[75] Inventors: Matuju Yoshida, Bisai; Shukichi Hayashi, Kariya, both of Japan

[73] Assignee: Nippondenso Co., Ltd., Kariya, Japan

[21] Appl. No.: 967,498

[22] Filed: Dec. 7, 1978

[30] Foreign Application Priority Data

Jan. 19, 1978 [JP] Japan .................................... 53-4871

[51] Int. Cl.[3] ........................ H03K 5/13; G06F 15/20

[52] U.S. Cl. .................................... 364/431; 123/491; 364/900; 371/12; 371/66

[58] Field of Search ........................ 364/431, 424, 900; 123/32 EB, 117 D; 371/12, 66

[56] References Cited

U.S. PATENT DOCUMENTS

| | | | |
|---|---|---|---|
| 3,824,383 | 7/1974 | Inose et al. | 371/12 |
| 4,045,661 | 8/1977 | Antoine et al. | 371/12 |
| 4,072,852 | 2/1978 | Hogan et al. | 371/12 |
| 4,163,282 | 7/1979 | Yamada et al. | 364/431 |
| 4,164,032 | 8/1979 | Nohira et al. | 364/431 |
| 4,205,376 | 5/1980 | Yoshida | 364/424 |

FOREIGN PATENT DOCUMENTS

| | | | |
|---|---|---|---|
| 2755015 | 6/1978 | Fed. Rep. of Germany | 123/486 |

OTHER PUBLICATIONS

Creamer et al.: Controlled Reentry on Storage Errors, IBM Technical Disclosure Bulletin, vol. 11, No. 9, Feb. 1969, pp. 1100/1101.

*Primary Examiner*—Felix D. Gruber
*Attorney, Agent, or Firm*—Cushman, Darby & Cushman

[57] ABSTRACT

Apparatus for initializing a vehicle control digital computer to prevent erroneous operation. The apparatus comprises a circuit for generating a pulse signal with a predetermined fixed period and a circuit for supplying the pulse signal to the vehicle control digital computer. The computer is initialized by the pulse signal so that even if erroneous operation occurs in the computer, the control program starts normally from the beginning by the succeding initalizing operation.

4 Claims, 12 Drawing Figures

APPARATUS FOR INITIALIZING A VEHICLE CONTROLLING DIGITAL COMPUTER

BACKGROUND OF THE INVENTION

This invention relates to a fail-safe system which, through periodic initialization, prevents erroneous operation of a vehicle control computer that processes various calculations of a control system of a vehicle by a software program.

It is well known, e.g. in U.S. Pat. No. 3,969,614 and U.S. Pat. No. 3,835,819 etc., that an integrated digital microcomputer may be used to control vehicle systems. However, when the computer is mounted on a vehicle without any modification and used on it, register memories may be disturbed by ignition pulses supplied to the vehicle engine and other external noise, resulting in erroneous operation. Furthermore, under the conditions of high temperature and high moisture, the computer itself or a part of the content of the memory may be damaged. When the engine is cranking, the power supply voltage of the vehicle decreases considerably, particularly at low temperatures. At such times there may be a danger that the control flow is disturbed and the computer stops operation. A publicly known countermeasure for preventing erroneous operation of the computer is to detect the state of error in the computer and then to instruct a safe operation to it in accordance with the result of detection.

However, in the prior art method, it was necessary to provide a special means for discriminating the error. The means itself can not bring forth any desired effect in such a severe vehicle environment as described above. On the other hand, a problem of cost increase arises. As is well known in the art, when computers typically found in automotive control systems are supplied with a low voltage, or intense noises induced about the computer, all functions of the computer may be stopped. Many prior art systems do not provide means for restoring the operation of the computer.

SUMMARY OF THE INVENTION

This invention is made in view of the abovementioned problem. The object of the invention is to provide a fail-safe system for a vehicle control computer to return the computer to normal operation through a succeeding initializing operation even after erroneous operation in the computer, by periodically initializing the computer and performing the calculation process from the initial state of the control program every predetermined time.

The time period between initializations is determined taking into consideration the time required for the control computer to perform various calculations and the degree of influence of the period of erroneous operation of the computer to the practical control of the computer. Although the interval between adjacent initializing operations is preferably short in view of safety, an interval which is to brief may disturb other calculation processes. By setting a suitable time interval, the normal state can be recovered with little influence of the erroneous operation even if erroneous operations occur. In order to restart the functioning of the microprocessor, it is necessary to initialize the microprocessor and restart the program. According to the present invention, when initialization is carried out, all of the internal elements of the microprocessor that are initialized when power is first turned on are reinitialized, and whatever state the microprocessor may be in when initialization is started (that is, e.g., even while the interruption processing is being carried out, or even when instructions are being carried out), and the program starts from the beginning, that is from the sequence when the power supply is switched on.

BRIEF DESCRIPTION OF THE PREFERRED EMBODIMENT

Figure 1:
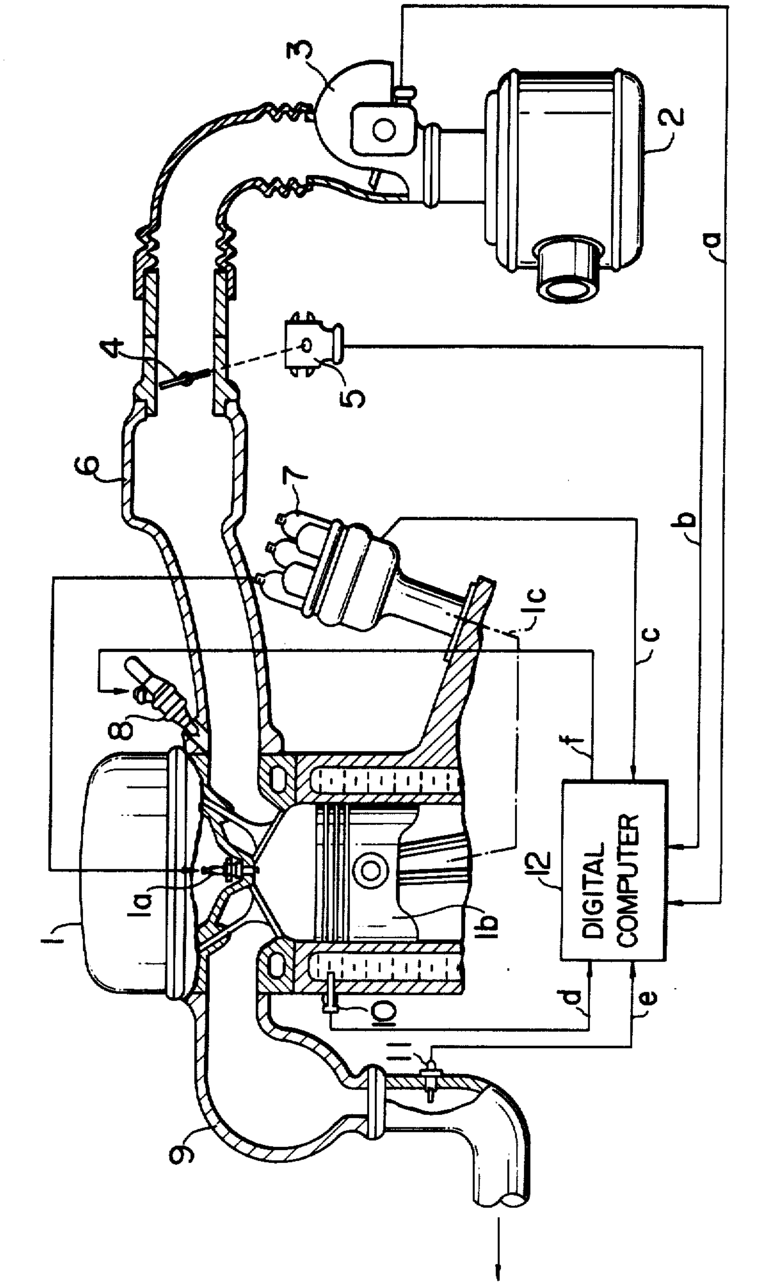
FIG. 1 shows a whole construction diagram of an embodiment of this invention applied to a fuel injector control means of an internal combustion engine.

In FIG. 1, a means for performing the fuel injection control of a vehicle internal combustion engine using a vehicle control computer is shown. The reference numeral 1 denotes a 6-cylinder internal combustion engine having a spark plug 1*a*, a piston 1*b* and an output rotary shaft 1*c*, etc. 2 denotes an air intake cleaner, 3 is a sensor for measuring the quantity of intake air which yields an analog output proportional to the air quantity, 4 denotes a throttle valve, and 5 denotes a throttle sensor which is engaged with the throttle valve 4 and detects the full close and an opening angle larger than 50°. 6 denotes a surge tank connected to an air intake manifold. 7 denotes a distributer which is driven by the output rotary shaft 1*c* and has functions of detecting the rotation number of the internal combustion engine and of distributing the ignition energy supplied from an ignition coil (not shown) to the spark plug 1*a* of each cylinder. 8 denotes an electromagnetic valve for injecting pressurized fuel from a fuel source (not shown), where the injection quantity of fuel is controlled by the valve open time $\tau$. 9 denotes an exhaust manifold and 10 denotes a water temperature sensor using a thermistor to detect the temperature of cooling water for the internal combustion engine. 11 denotes an oxygen sensor having a composition of $Pt\text{-}ZrO_2$ series for detecting the ratio of the quantity of air to that of fuel in the exhaust gas. 12 denotes a control computer which receives as its inputs an output (a) of the intake air quantity sensor 3, an output (b) of the throttle sensor 5, rotation number signal (c), an output (d) of the water temperature sensor 10, and and output (e) of the oxygen sensor 11, calculates the fuel supply quantity (or the open valve time $\tau$) and controls the internal combustion engine 1 in accordance with an output (f) of the open valve time $\tau$ of the electromagnetic valve 8. The control computer 12 can perform a calculation of the ignition angle together with other calculations by utilizing a spare time period during the calculation of the fuel supply quantity.

Figure 2:
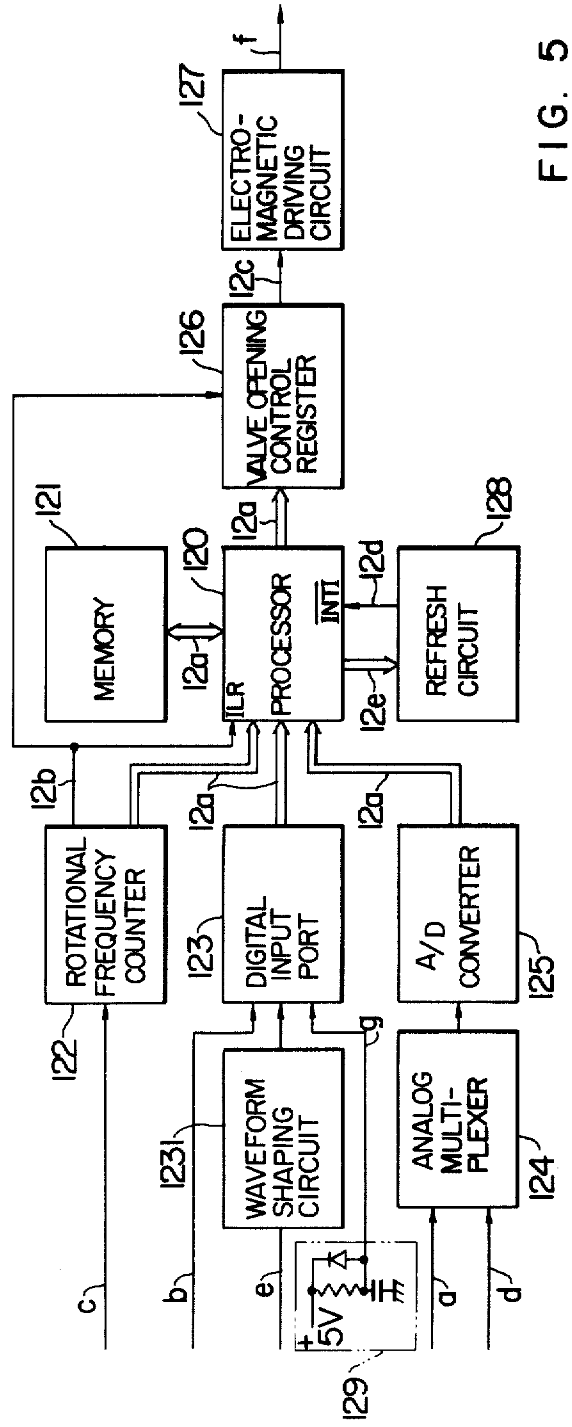
FIG. 2 shows a block diagram showing the construction of a control computer 12 of FIG. 1.

FIG. 2 shows a construction of the control computer 12 of FIG. 1. The reference numeral 120 denotes a well-known micro processing unit, using a T3190 of Toshiba Co., Ltd. Japan. The processor 120 has an interrupt request terminal ILR and an initialize terminal $\overline{\text{INTI}}$. 121 denotes an external connection memory accommodating a control program for controlling the internal combustion engine, where data are transferred on a common bus 12*a*. 122 denotes a counter for the number of revolutions which measures the number of revolutions Ne of the internal combustion engine by the rotational frequency signal output (c) of the distributer 7 and yields an output of the measured digital value to the common bus 12*a*. When one revolution of the engine is detected, a fuel injection interrupt request signal 12*b* is supplied to the interrupt request terminal ILR of the processor 120. 123 denotes a digital input port which receives the signal output (b) of the throttle sensor 5, the output (e) of the oxygen sensor 11 and the signal output (g) corresponding to the voltage supply for the control computer, and converts them into digital signals suitable for inputs to the processor 120. The numeral 1231 denotes a waveform shaping circuit for converting the signal output (e) of the oxygen sensor 11 to a voltage level acceptable for the digital input port 123, yielding outputs "0" and "1" when the air excess rate $\lambda$ is above and below 1.00 indicative of the stoichiometric air-fuel ratio respectively. 124 denotes an analog multiplexer which selects the output (a) of the intake air quantity sensor 3 and the output (d) of the water temperature sensor (THW) in accordance with an instruction (not shown) of the processor 120. 125 denotes an A/D converter which converts an analog signal to a digital signal. 126 denotes valve opening control register which stores the open valve time $\tau$ of the electromagnetic valve 8 by a store command from the processor 120 and outputs an open value time signal 12*c* corresponding to the stored value based on a signal which corresponds to the rotational angle of the engine given by the rotation number counter 122. 127 denotes an electromagnetic valve driving circuit which amplifies the open valve signal 12*c* and controls the open valve time $\tau$ of the electromagnetic valve to control the quantity of fuel supplied to the internal combustion engine 1.

128 denotes a refresh circuit which applies an initialization signal 12*d* periodically to an initialization terminal $\overline{\text{INTI}}$ of the processor 120 to initialize the control program in force. 12*e* shows an inhibit signal on the common bus 12*a*, which is applied from the processor 120 to the refresh circuit 128 to inhibit the generation of the initializing signal 12*d* when initialization should be avoided in view of the flow of control program requirements by all means. 129 denotes a circuit having a function of suppressing noise by using a time constant circuit formed by a resistor and a condenser, etc. for generating a signal related to the supply voltage for the control computer 120.

FIG. 3 is a flow chart of the fuel injection control program, showing the flow of program stored in the memory 121. The open valve time $\tau$ of the electromagnetic valve 8 determining the full injection quantity is determined by $$\tau = K \cdot Q/N_e \cdot f(THW) \cdot f(PO_2) \cdot f(AEW) = Q/N_e \cdot r. \qquad (1)$$

where K is a proportional constant inherent to the internal combustion engine 1, Q is the quantity of intake air, $N_e$ is the number of revolutions, f(THW) is a coefficient determined by the water temperature alone, $f(PO_2)$ is a coefficient determined by the output state of the oxygen sensor and time, and f(AEW) is the characteristic of the acceleration increase of the engine for warm-up.

Figure 3B:
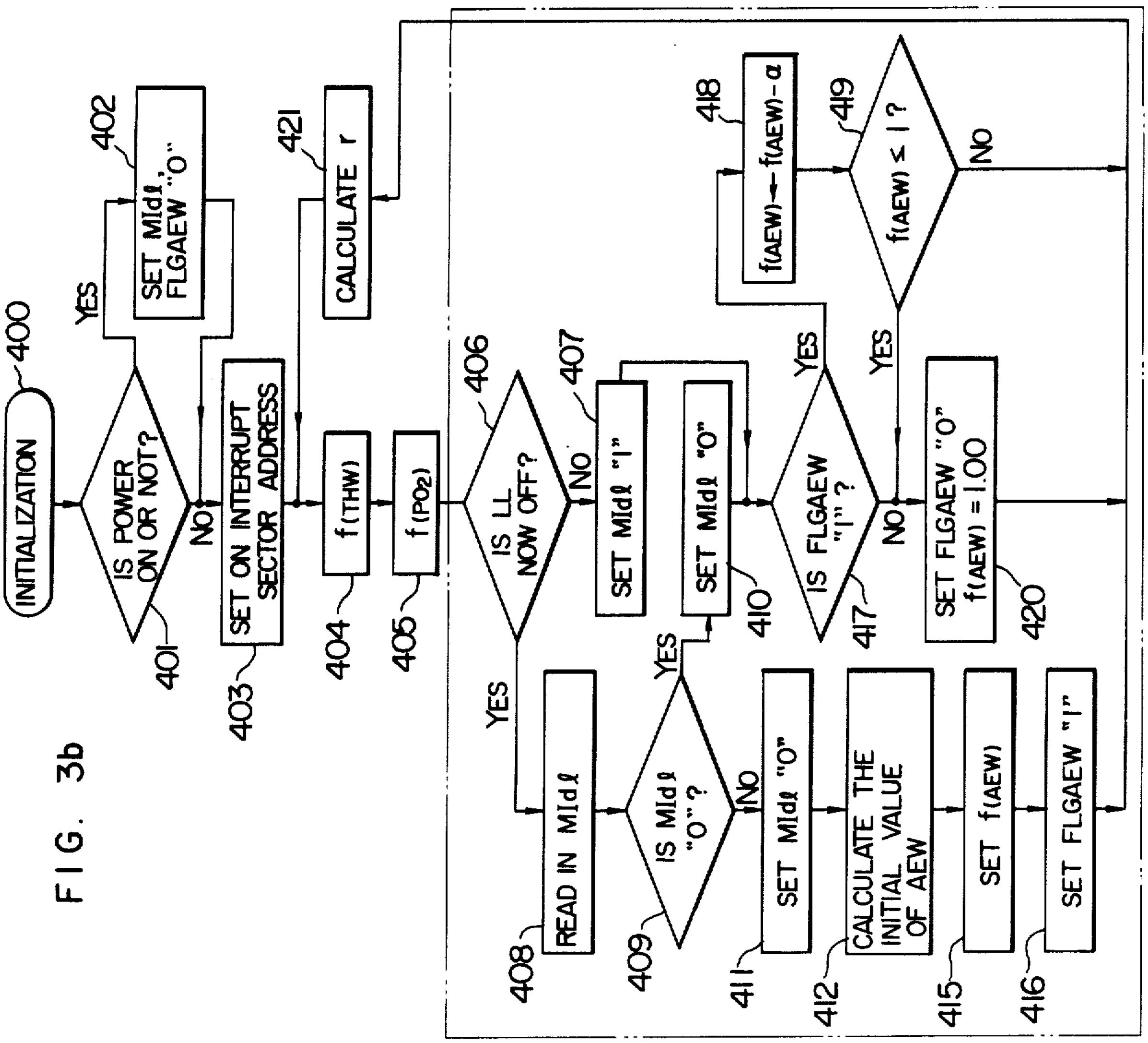
FIG. 3*a* and 3*b* shows a flow chart showing the calculation process of the control computer in FIG. 2.
Figure 3A:
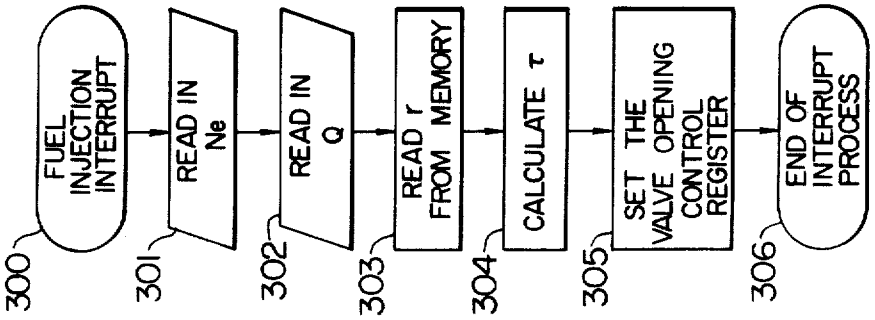

In the calculation process of the equation (1), FIG. 3*a* shows a fuel injection interrupt process to measure Q and $N_e$ through an interrupt process and calculate $Q/N_e \cdot r$, or the fuel injection quantity. When one revolution of the engine is detected by the rotational frequency counter 122, the fuel injection interrupt in stage 300 is started by an interrupt request signal 12*b*. In the stage 301, information on the rotational frequency of the counter 122 is read in. In the stage 302, the quantity of intake air Q is read in. In the stage 303, r is read out of the memory 121, and in the stage 304 calculation of the equation (1) is made to obtain the open valve time $\tau$. In the stage 305, the value $\tau$ is written into an open valve control register 126 and in the stage 306 the interrupt process is finished.

FIG. 3(*b*) shows an operaton of the current task other than the above fuel injection interupt, where the temporary variation of parameters is smaller than that of Q and $N_e$. consequently, calculation of the coefficients f(THW), $f(PO_2)$, and f(AEW) in the equation (1), calculation of r and vector adress setting of the interrupt are performed.

Figure 4:
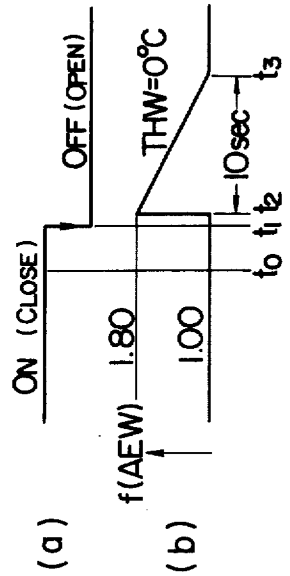
FIG. 4 shows a characteristic diagram of a part of the control in practice done by the execution of the calculation process of FIG. 3.

FIG. 4 shows an example of the controls in the process of FIG. 3*b*, showing particularly variation of control parameters when the throttle sensor 5 changes from an idle state (throttle valve closed fully) to a half open state. (a) shows the state of a full-close switch (hereinafter referred to as a LL switch) while (b) shows the characteristic of the acceleration increase of engine for warm-up, f(AEW). When the LL switch changes from ON to OFF state at a time $t_1$, f(AEW) is increased by 80% if the temperature of cooling water is 0° C., and at $t_3$ f(AEW) is reduced to zero.

In FIG. 3*b*, the stage 400 is an initialization stage, which starts when the power supply for the processor 120 is made on or when an initialization signal 12*d* from the refresh circuit is received. In the stage 401, the on-off of the power supply is decided depending on the output g of a detection circuit 129 of the power supply. If the power supply is on, addresses MIdl (status of the LL switch) and FLGAEW (status while increasing acceleration of engine for warm-up) are cleared to "0" for preparation of later stages. The stage 401 is followed by a stage 403. If the power supply is not on, the interrupt vector address is set into a RAM area (not shown) of the memory 121 in the stage 403. In a stage 404, f(THW) for controlling the water temperature is obtained. In a stage 405, the ratio of air to fuel quantity is calculated from the output of the oxygen sensor 11 and the time lapse, obtaining $f(PO_2)$. Stages 406 to 420 constitute detail flow charts of a block for obtaining the characteristic of the acceleration increase of engine for warm-up, or f(AEW). Stages 404 and 405 are divided into various parts, but since the program of these stages are publicly known, only a part of them necessary for the explanation of this invention will be described later.

Stages 404 to 420 constitute an endless loop where after r is calculated in a stage 421 the process returns to the state 404. Although the memory 121 is used for control flags MIdl and FLGAEW as their recording media, in order to increase reliability another memory may be used for the exclusive use for all the control flags including those not shown here.

A stage 406 is a block for discriminating the state of the LL switch. Namely, MIdl is set "1" in the stage 407 if the LL switch is on to detect the change from on to off of the LL switch. If the LL switch is off, the process advances to a stage 408 and MIdl is read out of the memory 121 (or the state of LL switch in the foregoing cycle is read out). In a stage 409, if MIdl is judged to be "0" showing that the LL switch is in the off state, the process advances to a stage 410 to set MIdl "0". In the stage 409, if MIdl is judged to be "1" showing that the LL switch has changed from on to off state, the process advances to a stage 411 to set the initial value of the acceleration increase of engine for warm-up. In the stage 411, it is declared that the LL switch is off. In a stage 412, the initial value of the acceleration increase of engine for warm-up is calculated. In a stage 415, f(AEW) is set. In a stage 416, the control flag FLGAEW is set "1", whereby it is declared that the initial value of the increment acceleration of engine is set. If the LL switch is turned off from the on state, the process advances to a stage 417, where it is discriminated by FLGAEW whether the engine is accelerated or not (in FIG. 4, FLGAEW is "1" in a period between $t_2$ and $t_3$). In the stage 417, if FLGAEW is "1", it is decided that the engine is being accelerated and the process advances to a stage 418 where f(AEW) is set again. If the resultant f(AEW) is less than or equal to 1.00, showing that the acceleration of the engine has finished, the end state is discriminated in the stage 419. If f(AEW)$\leqq$1, the process advances to a stage 420 to set FLGAEW "0" and f(AEW) 1.00, thereby inhibiting the acceleration of the engine.

The control program is constracted by the above-mentioned flow, but when the initialization signal 12*d* is applied periodically, if the initialization signal 12*d* appears inadvertently especially during the processing in the stages 407, 410, 411, 412, 415, 416 and 420, setting of the flags MIdl and FLAGAEW for controlling the program flow is disturbed to such an extent that the transfer of MIdl and FLGAEW into the memory 121 becomes impossible, and it becomes impossible to realize a characteristic of an acceleration increase of engine for warm-up as shown in FIG. 4. Therefore, a command is inserted at the head of each stage to output an inhibit signal 12*e* for inhibiting any reinitialization signal 12*d* during the period of each stage.

Figure 5:
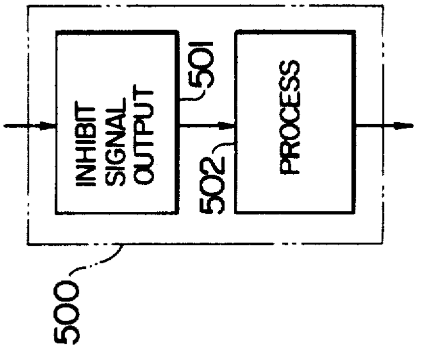
FIG. 5 shows a representative flow chart of detail of the essential parts of the calculation process of FIG. 3.

FIG. 5 is a flow chart showing the interior of the stages 407, 410, 411, 412, 415, 416, and 420. A stage 500 represents each of these stages. A stage 501 yields the inhibiting signal 12*e*. A stage 502 is a concrete process stage. The refresh circuit 128 of FIG. 2 makes the calculation process of FIG. 3*b* reinitialized by the initialization signal 12*d* generated periodically. But, an inhibiting signal 12*e*, when applied, inhibits the generation of the initialization signal 12*d* for a predetermined period.

Figure 6:
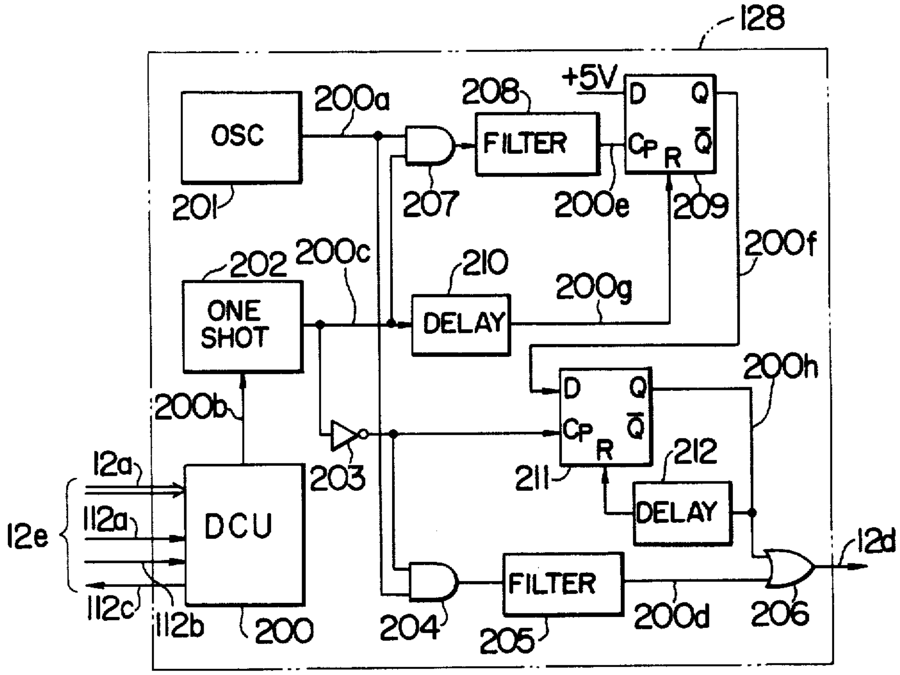
FIG. 6 shows an electric connection diagram of the detailed construction of a refresh circuit 128 of FIG. 2.

FIG. 6 shows the detailed inner part of the refresh circuit 128, in which the reference numeral 200 denotes a device control unit (hereinafter referred to as DCU), for which Toshiba T3418 is used. DCU receives the initialization inhibit signal 12*e* from the processor 120. The inhibit signal 12*e* is distributed into the common bus 12*a* and a bus control line, the latter containing control signals C1(112*a* in the figure), C2(112*b*) and ACK(112*c*). In this embodiment, when the processor accesses DCU 200, a pulse like signal appears on a line 200*b* as an initialization inhibit signal. 201 denotes an oscillator which sends a pulse signal on a line 200*a*. The period of this pulse signal becomes a base for the repetition period of the initialization signal, being set about 0.5 sec. Furthermore, the pulse width is chosen large enough to initialize the processor 120. 202 denotes a one shot multivibrator giving a pulse of constant time width in synchronization with a rise of the initialization inhibit signal 200*b*. The pulse width is set at 200 μsec., so that at least more than 10 program steps of the processor 120 may be operated. 203 denotes an inverter for inverting the output of the one shot multivibrator 202. 204 denotes an AND gate which passes a pulse like signal of the oscillator 201 when the output pulse of the one shot multivibrator 202 is not produced. 205 denotes a low pass filter which cuts any signal with a pulse width less than 30 μsec. 206 denotes an OR gate. 207 denotes an AND gate which passes the output pulse of the oscillator 201 when an initialization inhibit signal is present. 208 denotes a filter which cuts any signal with a pulse width less than 30 μsec. The filter 208 has the same function as that of the filter 205. 209 denotes a D flip-flop which sets its Q output "1" at a rising time of a pulse signal having passed the filter 208. 210 denotes a delay circuit which yields an output after 10 μsec. from the falling edge of the one shot multivibrator 202 and resets the flip-flop 209. 211 denotes a D flip-flop which stores the state of the Q output of the flip-flop 209 at the falling edge of the output of the one shot multivibrator 202. 212 denotes a delay circuit which resets the flip-flop 211 at about 100 μsec. after the Q output of the flip-flop 211 becomes "1".

Figure 7:
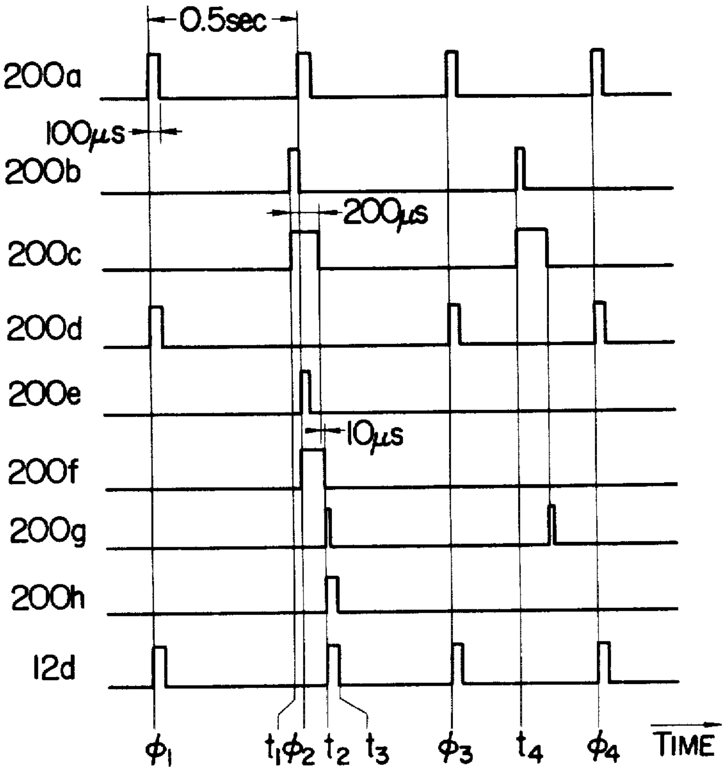
FIG. 7 shows time charts for explanation of the operation of the refresh circuit of FIG. 6.

FIG. 7 shows time charts for explanation of the operation of the refresh circuit 128, and the time chart shows signal states on the labelled lines in FIG. 6.

The operation of the refresh circuit will be described next with reference to FIGS. 6 and 7. At a time $\phi_1$, when a pulse signal 200*a* is supplied from the oscillator 201, since DCU 200 is not accessed, the one shot multivibrator 202 does not operate, and an initialization signal 12*d* appears through the AND gate 204 and the OR gate 206. If at a time $t_1$ a little before $\phi_2$ an inhibit signal 12*e* is supplied from the processor 120, DCU 200 is accessed and the one shot multivibrator 202 yields a 200 μsec. pulse on 200*c* till a time $t_2$. At $\phi_2$ which is 0.5 sec. after $\phi_1$, the pulse signal on 200*a* is inhibited by the AND gate 204 so that no initialization signal appears. On the other hand the pulse signal 200*a* is applied to a flip-flop 209 as a pulse on 200*e* through the AND gate 207 and the filter 208, and it makes the set output on 200*f* of "1" level. The flip-flop 209 is reset by a pulse on 200*g* generated by the delay circuit 210 at a time $t_3$ after 10 μsec. from a fall of the pulse on 200*c*. The flip-flop 211 latches the state on 200*f* at the fall of the pulse on 200*c*, and is reset by a pulse from the delay circuit 212 after about 100 μsec. That is, the pulse signal on 200*a* at $\phi_2$ appears shifted by about 200 μsec. at the output, when an inhibit signal is supplied from the processor 120. It is needless to say that within about 200 μsec. the operation of the state, which instructed a generation of the inhibit signal 12*e*, finishes. At a time $t_4$ at which no pulse is present on 200*a*, when an inhibit signal is applied, all the operations are inhibited by AND gates 204 and 207, no initialization signal being given since the line 200a is held at "0" level.

In the above explanation of the refresh circuit 128 which generates a periodic initialization signal 12d but inhibits its generation temporarily when an initialization inhibit signal 12e is supplied from a processor 120, it will be understood that the control computer is initialized periodically by its initialization signal. As described above, the refresh circuit 128 is provided with a self-oscillator 201 which generates a reference pulse signal independently of the processor 120 and initializes the processor 120 at a constant period, so long as no inhibit signal 12e is supplied from the processor 120. Even if the processor 120 should operate erroneously and the function of generating the inhibit signal should become abnormal, the refresh circuit 128 can still generate an initialization signal. Erroneous operation of the processor means either an operation stop or abnormal flow of the control program. In both cases, the output line 200b of DCU 200 is set either at the "0" or "1" level with a high probability. However, with insertion of the one shot multivibrator 202, the line 200c becomes "0" level within at least 200 μsec. after the erroneous operation. This opens the AND gate 204, enabling passage of the pulse signal of the oscillator 201.

Figure 8:
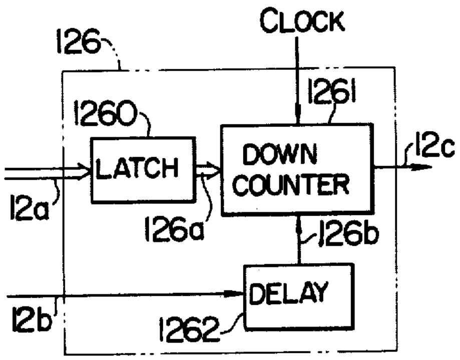
FIG. 8 shows an electric connection diagram of the detailed construction of an open valve controlling register 126.

Such a disadvantageous situation where the initialization signal 12d appears periodically in the processor can also occur in the hardware. More precisely, in FIG. 3, if an initialization signal 12d appears in the stage 305, where the open valve control register for fuel injection is being set, it can disable this setting. FIG. 8 is a detailed diagram of the fuel injection register 126. The reference numeral 1260 denotes a 12 bits latch which is capable of being rewritten by a store instruction from the processor 120. So long as the processor 120 does not write in "0", the content of the latch 1260 is not reset. 1261 denotes a 12 bits down counter which converts an output 126a of the latch 1260 into serial data and makes an open valve signal 12c. 1262 denotes a delay circuit which, with a delay corresponding to a sum of process times of stages 300 to 306 and 500 μsec., gives a trigger pulse for initializing fuel injection to the down counter 1261. In this construction, even if the stage 305 is disabled by reinitialization, the aforementioned electromagnetic valve 8 can operate normally in accordance with the data stored in the foregoing cycle.

Figure 9:
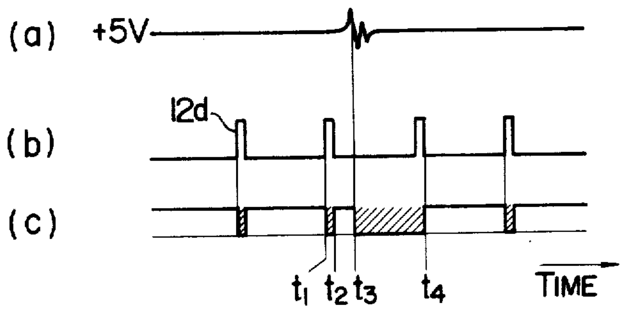
FIG. 9 shows an operation state chart of the relation between the real control of a control computer and an initializing operation.

Next, explanation will be made of the initialization function of the control computer and the real control of the internal combustion engine by the control computer, using an operation state diagram of FIG. 9, in which (a) shows a power supply voltage representing an operation state of the control computer, (b) shows an initialization signal or the output of the refresh circuit 128, and (c) shows the normal state and an abnormal or stop state of the control computer, the hatched part showing an abnormal period or stop period due to reinitialization. Before a time $t_1$ the control program operates normally. That is, the fuel injection is made normally in the internal combustion engine. When at the time $t_1$ an initialization signal 12d is generated by a refresh circuit 128, the control computer stops its operation. At a time $t_2$, the program returns to the stage 400 of the flow chart of FIG. 3. An interrupt vector address is set as an initial value setting. Assuming that at a time $t_3$ an electric noise enters into the power supply, causing a disturbance in he operation of the processor 120 and an abnormal flow of the control program. Then, after the time $t_3$, a normal fuel injection stops. However, if at a time $t_4$ an initialization signal 12d is generated by the refresh circuit 128, the control program is initialized again and a normal state of fuel injection is restored. In the present embodiment, the period between $t_2$ and $t_4$ is set about 0.4 second. An abnormal operation with an order of 0.5 second is smoothed by inertia of the transmission mechanism between the internal combustion engine 1 and vehicle (not shown). So, no trouble appears in the actual motion of vehicle. After the time $t_4$, a perfectly normal operation is reset.

Figure 10:
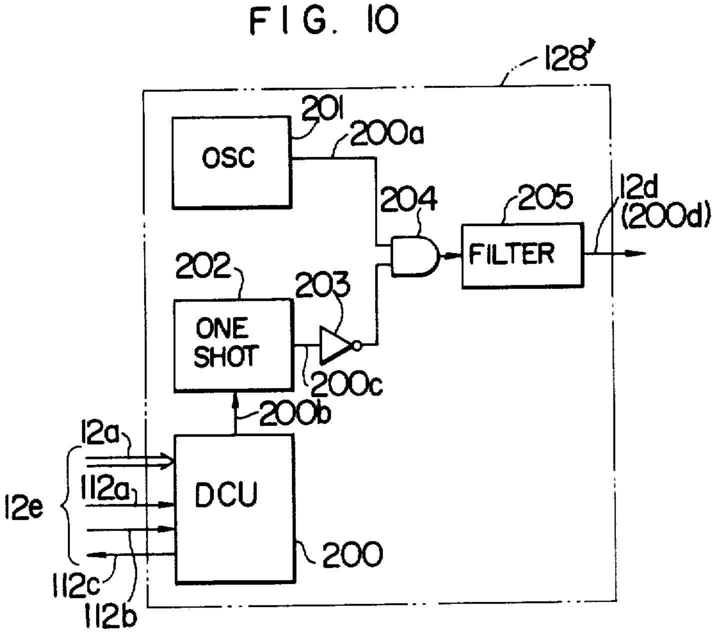
FIG. 10 shows an electric connection diagram of another example of a refresh circuit.
Figure 11:
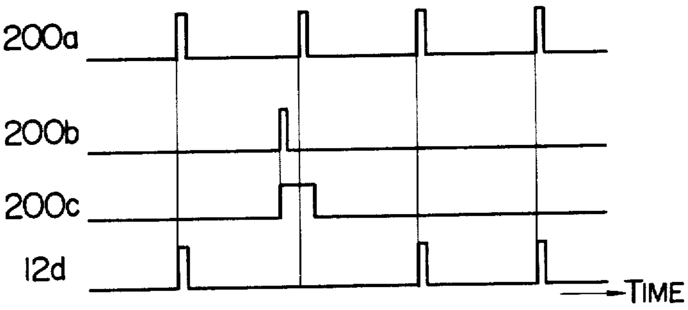
FIG. 11 shows a time chart for explanation of the operation of the refresh circuit of FIG. 10.

FIG. 10 shows another example of the refresh circuit 128 shown in FIG. 2, which simplifies the circuit construction shown in FIG. 6. FIG. 11 shows time charts demonstrating the operation of the refresh circuit 128'. In FIG. 10, like reference numerals are used to denote like parts as used in FIG. 6. The only difference lies in the fact that, since no temporary memory for the pulse signal of the oscillator 201 is provided, an initialization inhibit signal supplied from the processor 120 inhibits immediately the initialization signal without any delay.

Although the above embodiments relate to a control computer for controlling the fuel injection of an internal combustion engine, the invention may be likely applied to an ignition time control, a combustion control including the recirculation of exhausted gas, and a control of the quantity of intake air with use of a control computer. It is needless to say that this invention can be applied also to controls other than that of the internal combustion engine, e.g. skid control of a vehicle and a meter display, and automatic speed change control.

In a case where the flow of a control program need not be monitored, that is, in the foregoing embodiment, if there is no control variable changing with time such as the acceleration increase of engine for warm-up, the control flags, MIdl and FLGAEW etc., are not necessary. Namely, there is a case where means for temporarily storing these flags is not required. In a control of this type, it is possible to prevent an error operation only by reinitializing the control computer periodically.

As described above, according to this invention, since the control computer is provided with a means for initializing it periodically regardless of the error operation, even if a error happens in the control computer, the initialization is still ensured after a predetermined time. Therefore, the invention has such an excellent property that even under a severe external noise, high temperature and moisture conditions, various control systems of the vehicle can be operated safely.

We claim:

1. An apparatus for initializing a digital computer mounted on an automotive vehicle and programmed to repetitively perform calculations required for said vehicle according to preestablished calculation sequences, said apparatus comprising:

means for electronically producing periodic pulses at a fixed frequency;

means for producing a prevention output indicative of at least one of said preestablished calculation sequences being performed; and means, responsive to said periodic pulses, for causing said digital computer to be initialized, said causing means including means for generating computer initializing signals, means for applying said initialization signals to an initialization input of said computer, and means for delaying said periodic pulses in response to said prevention output so that said digital computer is initialized after performance of said at least one of said preestablished calculation sequences.

2. An apparatus for initializing a digital computer mounted on an automotive vehicle and programmed to perform calculations required for controlling a combustion engine mounted on said automotive vehicle, said calculations being performed in accordance with preestablished calculation sequences and repeated at uniform angular intervals of rotation of said combustion engine, said apparatus comprising:

means for producing periodic pulses at a fixed frequency;

means for applying said periodic pulses to said digital computer as computer initializing signals;

means for generating rotation pulses at said uniform angular intervals of rotation, connected to said digital computer to cause repetition of said calculations;

means for converting the result of said calculations of said digital computer into a control pulse used to control said combustion engine; and means for delaying said rotation pulses, disposed between said rotation pulses generating means and said converting means, to initiate operation of said converting means by delayed rotation pulses.

3. Apparatus for correcting the operation of a digital computer mounted in and used to control an automotive vehicle in accordance with a preestablished sequence of instructions, said apparatus comprising:

an oscillator disposed external to said computer for generating periodic pulses; and means for transmitting said pulses to an initialization input of said computer, said transmitted pulses periodically initializing said computer by causing said computer to break from executing an instruction from said sequence of instructions and to restart executing said sequence of instructions from the first of said sequence as if power had just been applied to said computer.

4. Apparatus for correcting the operation of a digital computer mounted in an used to control an automotive vehicle in accordance with a preestablished sequence of instructions, said apparatus comprising:

an oscillator disposed external to said computer for generating periodic pulses;

means, disposed in said computer, for generating an inhibit signal during execution of predetermined instructions in said sequence of instructions;

means for generating a delayed pulse when one of said periodic pulses coincides with said inhibit signal, said delayed pulse occurring after said inhibit signal; and means for applying to an initialization input of said computer said periodic pulses when said inhibit signal is not being generated and each said delay pulse to periodically initialize said computer to break from executing an instruction from said sequence of instructions and to restart executing said sequence of instructions from the first of said sequence as if power had just been applied to said computer.

* * * * *